March 26, 1957 E. R. SHENK 2,786,944
CONSTANT AMPLITUDE OSCILLATOR
Filed April 2, 1954
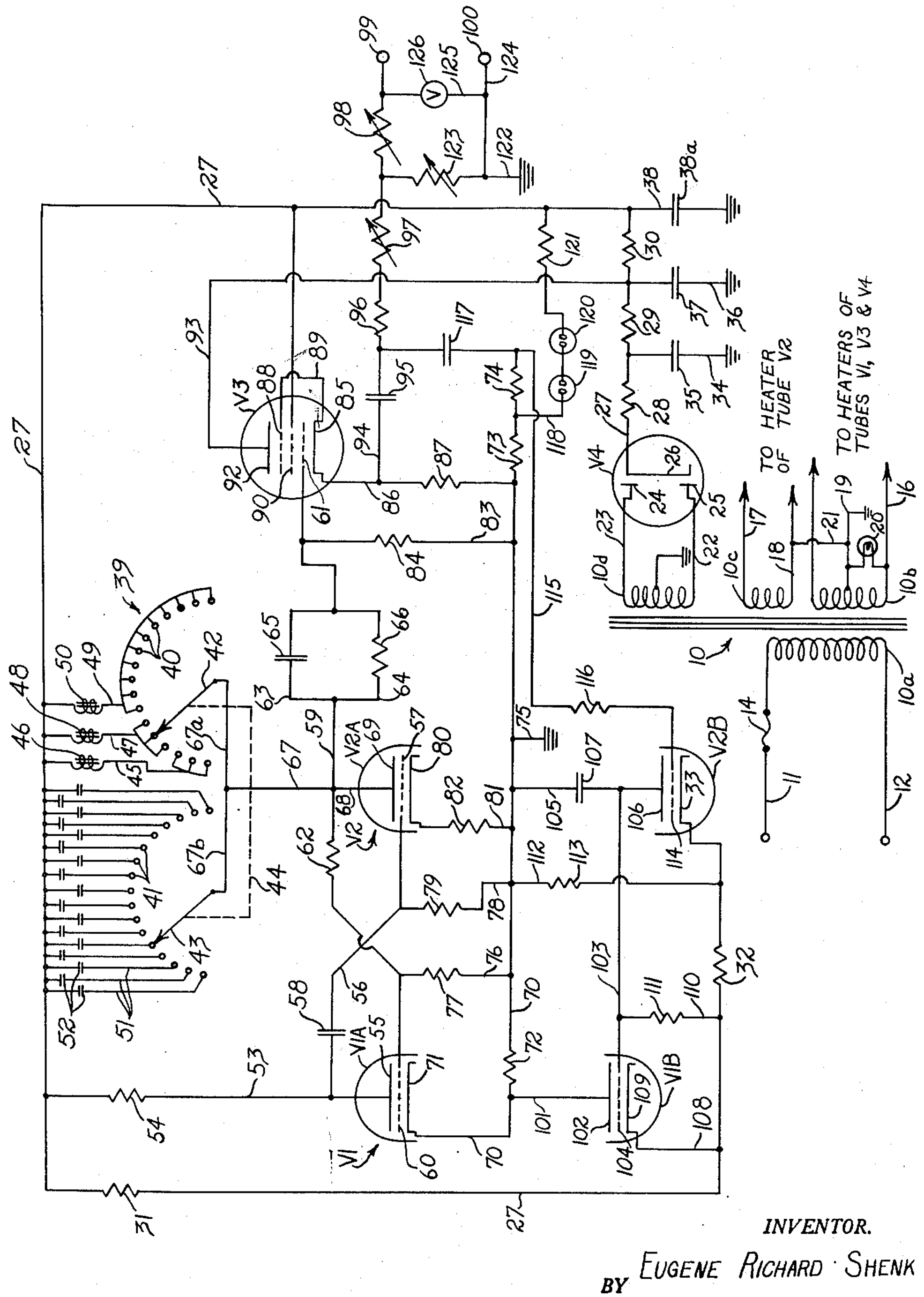
INVENTOR.
EUGENE RICHARD SHENK
BY John G. Schwartz
AGENT United States Patent Office 2,786,944

Patented Mar. 26, 1957

2,786,944

CONSTANT AMPLITUDE OSCILLATOR

Eugene Richard Shenk, Bergenfield, N. J., assignor to Pulse Techniques, Inc., West Englewood, N. J., a corporation of New Jersey Application April 2, 1954, Serial No. 420,564

11 Claims. (Cl. 250—36)

The present invention proposes an improved oscillator and, more particularly, it is the primary purpose of the present invention to provide a sine wave oscillator having low distortion and great stability of amplitude over a wide range of frequencies.

Still further, the present invention proposes an improved automatic gain control such that the amplitude of the oscillator output voltage is substantially independent of variations in power supply voltages and tube characteristics.

A further object of the present invention is the construction of an oscillator having a wide choice of fixed frequencies (e. g. a choice of any one of seventeen frequencies) which can be accurately selected without error resulting from inaccurate setting by the operator.

Another object of the present invention proposes the provision of a unique gain stabilizing circuit which will hold the amplitude variation within 0.2 decibel plus or minus over the entire range of selected frequencies from 20 C. P. S. to 100,000 C. P. S.

Still another object of the present invention proposes an oscillator which is small in size and light in weight making it easily portable and adapting to convenient on-the-job use.

It is a still further object of the present invention to construct an oscillator which is simple and durable, which is efficient in operation and which can be manufactured and sold at a reasonable cost.

The oscillator of the present invention is characterized by an output circuit and an oscillator circuit including means for tuning to a multiplicity of frequencies which is controlled in a novel manner by a manually operable step selector switch. A gain control circuit is operable to determine the amplification in the oscillator circuit with a connection from the output circuit to the gain control circuit so that a change in voltage in the output circuit operates to cause the gain control circuit to change the amplification in the oscillator circuit. The change in the gain control circuit is of opposite sense to the change in the output circuit so as to maintain the voltage in the output circuit substantially constant. The oscillator has a source of direct current potential for the gain control circuit and the output circuit.

For further comprehension of the invention, and of the objects and advantages thereof, reference will be had to the following description and accompanying drawing, and to the appended claims in which the various novel features of the invention are more particularly set forth.

On the accompanying drawing forming a material part of the present disclosure:

The single figure is a schematic wiring diagram of the preferred embodiment of the oscillator of the present invention.

The oscillator, according to the present invention, includes four tubes V1, V2, V3 and V4. The tubes V1 and V2 are twin triode tubes each having two complete tube components, which for ease of illustration on the accompanying drawing are shown separated. The components of the tube V1 are identified as V1A and V1B. The components of the tube V2 are identified as V2A and V2B. The tube V3 is an amplifier tube and the tube V4 is a rectifier.

A transformer 10 has a primary winding 10_a_ connected by leads 11 and 12 to a source of A. C. current. For safety of operation, the lead 11 may include a fuse 14. In addition, the transformer 10 has three secondary windings 10_b_, 10_c_ and 10_d_. The secondary winding 10_b_ has leads 15 and 16 connected to the ends thereof to provide current of one voltage to the heaters of the tubes V1, V3 and V4. Likewise, leads 17 and 18 are connected to the ends of the secondary winding 10_c_ to provide current of another voltage to the heater of the tube V2. The heaters for the tubes and their connections to the secondaries 10_b_ and 10_c_ of the transformer 10 have been omitted from the drawing for the sake of clarity and especially as such circuits are well known to those skilled in the art to which the present invention pertains.

A grounded lead 19 is connected to the secondary winding 10_b_ between its ends, and a small pilot lamp 20 is connected across the leads 19 and 16 to be illuminated and show that the device is in operation when the transformer 10 is energized. A lead 21 connects the leads 18 and 19.

The third secondary winding 10_d_ of the transformer 10 has its ends connected by leads 22 and 23 to the plates or anodes 24 and 25 of the tube V2. The cathode 26 of the tube V4 is connected to a lead 27 which includes in series five resistors 28, 29, 30, 31 and 32. The other end of the lead 27 is connected to the cathode 33 of the component V2B of the tube V2.

Extending from the lead 27 between the resistors 28 and 29, there is a grounded lead 34 which includes a capacitor 35. A grounded lead 36 extends from the lead 27 between the resistors 29 and 30 and includes a capacitor 37. A third grounded lead 38 extends from the lead 27, on the side of the resistor 30 remote from the tube V4, and also includes a capacitor 38_a_.

Between the resistors 30 and 31, the lead 27 has connected thereto a manually operable selector switch 39 for selecting any one of seventeen frequencies for the oscillator. The selector switch 39 has two separate banks of taps 40 and 41 with each set being scanned by a pivotally mounted arm of conductive material. The arm for the bank of taps 40 is designated by the numeral 42 and the arm for the bank of taps 41 by the numeral 43. Each bank of taps, as illustrated on the drawing, includes seventeen taps and the arms 42 and 43 are ganged as illustrated by the dotted line 44 to move in unison over the taps of the two banks. Movement of the arms 42 and 43 is controlled by a manually turnable knob, which is not shown on the drawing. The taps 40 and 41, as is known in the art, are mounted on dielectric material to be electrically insulated from one another.

Constructional details of the selector switch 39 form no part of the present invention, however, the use of such a selector switch to provide a uniform selection of any one of a number of fixed frequencies independent of skill on the part of the operator is an important feature of the present invention. Good results in the construction of the oscillator have been obtained using a selector switch available from the Oak Manufacturing Company of Chicago, Illinois.

Three of the taps 40 are connected to a lead 45 which includes an inductor 46. A lead 47 connects three more of the taps 40 and includes an inductor 48. The remaining eleven taps 40 are connected to a lead 49 which includes a third inductor 50. The leads 45, 47 and 49 are in turn connected to the lead 27 between the resistors 30 and 31.

Extended from each of the taps 41 there is a lead 51.

The leads 51 include in series a capacitor 52 and are connected to the lead 27 between the points of connection of the leads 45, 47 and 49 and the resistor 31. The inductors 46, 48 and 50 and the capacitors 52 comprise tuning elements making it possible to choose any one of seventeen frequencies on the oscillator in the range from 20 C. P. S. to 100,000 C. P. S. as will become clear as the present description proceeds.

Extended from the lead 27, between the points of contact of the leads 51 and the resistor 31, there is a lead 53, which includes a resistor 54 in series. The other end of the lead 53 is connected to the plate or anode 55 of tube component V1A of the tube V1. Extended from the lead 53, between the resistor 54 and the plate 55, there is a lead 56 which is connected to the grid 57 of the tube component V2A of the tube V2. Connected in series in the lead 56 there is a capacitor 58.

A lead 59 extends from the grid 60 of the tube component V1A of the tube V1 to the grid 61 of the tube V3. The lead 59 includes in series a resistor 62 and a pair of parallel leads 63 and 64. A capacitor 65 is connected in the lead 63 and a resistor 66 is connected in the lead 64. Between the resistor 62 and the branch leads 63 and 64, a lead 67 extends from the lead 59 and is connected to the arms 42 and 43 of the selector 39 by branch leads **67*a* and 67*b*. A second lead 68 extends from the lead 59, at a point between the resistor 62 and the branch leads 63 and 64 and is connected to the plate or anode 69** of the tube component V2A of the tube V2.

One end of a lead 70 is connected to the cathode 71 of the tube component V1A of the tube V1 and includes in series three resistors 72, 73 and 74. Between the resistors 72 and 73, a grounded lead 75 is connected to the lead 70. A lead 76 extends from the lead 70, is connected to the lead 59 and includes in series a resistor 77. Another lead 78 extends from the lead 70, is connected to the lead 56 and includes in series a resistor 79. Extended from the cathode 80 of the tube component V2A of the tube V2, there is a lead 81 which includes in series a resistor 82. The other end of the lead 81 is connected to the lead 70 between the point of attachment of the lead 78 and the grounded lead 75.

A lead 83 is extended between the leads 59 and 70 and includes in series a resistor 84. One end of the lead 83 is connected to the lead 59 between the branch leads 63 and 64 and the grid 61 of the tube V3. The other end of the lead 83 is connected to the lead 70 between the grounded lead 75 and the resistor 73.

The cathode 85 of the tube V3 is connected to the lead 70 by a lead 86 which includes in series a resistor 87. The suppressor 88 of the tube V3 is connected to the cathode 85 of that tube by a lead 89. The screen 90 of the tube V3 is connected by a lead 91 to the lead 27. The plate or anode 92 of the tube V3 is connected by a lead 93 to the lead 27 between the resistors 29 and 30.

A lead 94 extends from the lead 86, at a point between the cathode 85 of the tube V3 and the resistor 87 and includes in series a capacitor 95, a resistor 96 and a pair of variable resistors 97 and 98. The opposite end of the lead 94 is connected to one terminal 99 of a pair of output terminals 99 and 100.

Connected to the lead 70, between the cathode 71 of the tube component V1A of the tube V1 and the resistor 72, there is a lead 101 which has its other end connected to the plate or anode 102 of the tube component V1B of the tube V1. A lead 103 extends from the grid 104 of the tube component V1B and is in turn connected to a lead 105 which connects the lead 70 to the plate or anode 106 of the tube component V2B of the tube V2. The lead 105 includes in series a capacitor 107. If desired, that portion of the lead 105 including the capacitor could be connected between the lead 103 and the lead 27 between the point of connection 110 and the resistor 32.

A lead 108 extends from the cathode 109 of the tube component V1B of the tube V1 and is connected to the lead 27. The leads 27 and 103 are connected by a lead 110 which includes in series a resistor 111.

A lead 112 extends from the lead 70, includes in series a resistor 113 and is connected to the lead 27. The point of attachment of the lead 112 to the lead 70 is at a point between the resistor 32 and the cathode 33 of the tube component V2B of the tube V2.

Extended from a grid 114 of the tube component V2B of the tube V2, there is a lead 115 which has connected intermediate of its ends, the end of the lead 70. The other end of the lead 115 is connected to the lead 94 between the capacitor 95 and the resistor 96. Between the grid 114 and its point of connection to the end of the lead 70, the lead 115 includes in series a resistor 116. A capacitor 117 is connected in the lead 115 between its points of connection to the leads 70 and 94. The lead 115 with the capacitor 117 and the resistor 116 comprise the connection between the output circuit and the grid 114 of the tube V2B in the gain control circuit. The resistors 73 and 74 act to influence the voltage in the connection 115 from the capacitor 117 to the grid 114.

A lead 118 extends from the lead 70, between the resistors 73 and 74 and is connected to the lead 27. The lead 118 includes in series a pair of neon lamps 119 and 120 and a resistor 121. Experimentation has shown that in place of the two neon lamps 119 and 120, it is possible to employ at least one neon lamp which may or may not be used in series with the resistor 121 depending on the voltage in the lead 27. However, good results with reduction in production costs and size of the completed oscillator have been obtained with two lamps as shown on the drawing.

A grounded lead 122 extends from the lead 94 at a point between the variable resistors 97 and 98 and includes in series a variable resistor 123. The variable resistors 97 and 98 acting with the variable resistor 123 comprise a variable T pad to the output terminal 99. The resistors 97, 98 and 123 are ganged for manual operation by a single control knob. Connected to the lead 122, between the variable resistor 123 and the grounded end of the lead 122, there is a lead 124 which is connected to the other terminal 100 of the pair of output terminals 99 and 100. A lead 125 connects the leads 94 and 124 immediately adjacent the output terminals 99 and 100 and includes in series a voltmeter 126. The use of the lead 125 with the voltmeter 126 is optional and may be omitted if desired, without in any way affecting the operation of the oscillator.

It will be appreciated that the tube components V1A and V2A of the tubes V1 and V2 with the inductors 46, 48 and 50 and the capacitors 52 connected by the arms 42 and 43 to the plate 69 of the tube component V2A of the tube V2 comprise the oscillatory circuit. The tube components V1B and V2B of the tubes V1 and V2 and their related parts comprise the means for effecting rigid control over the amplitude of the oscillations of the tube components V1A and V2A of the tubes V1 and V2. The tube V3 constitutes the output stage; which is shown, by way of example only, as a cathode follower.

The tube V4 is the rectifier in the power supply which provides the voltage in the lead 27 for the oscillator. This is a common type of unregulated power supply which is well known in the art and no claim is made thereto.

The operation of the oscillator of the present invention is as follows:

The voltage developed across the resistor 54 of the plate 55 of the tube component V1A of the tube V1 is coupled across the resistor 79 of the grid 57 of the tube component V2A of the tube V2, by the capacitor 58 in the lead 56. The voltage developed across the parallel connections of the inductors 46, 48 and 50 and the capacitors 52 in the plate 69 of the tube component V2A of the tube V2 is partially coupled across the resistor 77 of the grid 60 of the tube component V1A of the tube V1, by the resistor 62. Thus, a closed feedback loop exists around the tube components V1A and V2A. Consequently, at some one frequency which, in practice, is determined almost solely by the characteristics of the inductors 46, 48 and 50 and the capacitors 52 the necessary conditions will exist for the circuit to oscillate. These conditons, as discovered and defined by Nyquist, are a loop phase shift of 360 degrees and a loop gain of one.

The circuit provided by the inductors 46, 48 and 50 and the capacitors 52 and their related parts of the oscillatory circuit are commonly referred to in the art as a "tank circuit."

Actually, the loop gain of the circuit will be greatly in excess of one and this ordinarily would result in large distortion currents flowing in the tube components V1A and V2A. However, it is the purpose of the tube components V1B and V2B of the tubes V1 and V2 to exercise a very great degree of control over the amount of gain provided by the tube component V1A and thereby to limit the loop gain of the tube components V1A and V2A to substantially unity.

If the cathode resistor 72 is rated at three megohm and the resistor 54 is rated at 0.33 megohm, the gain in the tube component V1A will be small—in the neighborhood of about 0.1. However, the tube component V1B of the tube V1 in series with the resistors 32 and 113 constitute a shunt across the resistor 72. By varying the magnitude of the voltage across the resistor 111, which is the grid bias or grid to cathode voltage of the tube component V1B, the static and the dynamic plate resistance of the tube component V1B can be controlled over wide limits; from perhaps 30,000 ohms or less to substantially infinite resistance. Thus, the effective value of cathode to ground resistance associated with the tube component V1A and, therefore, the gain of the tube component V1A and the loop gain of the tube components V1A and V2A, depend greatly on the plate resistance of the tube V1B which, in turn, is controlled by the grid bias voltage of tube component V1B, which is across the resistor 111.

Now it will be shown that the magnitude of the grid bias voltage on the tube component V1B is controlled by the amount of plate current flowing in the tube component V2B. This plate current is itself determined by the amplitude of the oscillations as reflected through the cathode follower output stage—tube V3.

The D. C. operating or supply voltages to the several elements of the tube component V2B are such that no plate current can flow in the absence of A. C. voltage in its grid circuit. The only source of A. C. voltage for the grid circuit of the tube component V2B is the output circuit of the tube V3. (This output circuit will be more fully described later in this explanation.) Further, it is apparent that there can be no A. C. voltage present at the output of the tube V3 unless the circuit including the tube components V1A and V2A is oscillating. It has now been clearly established, that no plate current can flow through the tube component V2B unless oscillations exist in the tube components V1A and V2A. In the absence of plate current through the tube component V2B, the voltage drop across the resistor 111 would, in theory, be zero except for what commonly is known as "contact potential" between the grid 104 and cathode 109 of the tube component V1B. Thus, the plate resistance of the tube component V1B is at a minimum and the loop gain of the oscillator circuit is at a maximum. This high value of loop gain is a desirable condition, because it encourages and facilitates the rapid establishment and building up of oscillations.

Any oscillations of the tube components V1A and V2A are coupled by the capacitor 65 into and across the resistor 84 and are, therefore, effective in varying the plate current of the tube V3. That plate current in flowing through the resistor 87 develops a voltage across it which is of oscillation frequency and proportional in magnitude to the oscillation amplitude.

This A. C. voltage (of oscillations frequency) across the resistor 87 is coupled by the capacitor 95 and through resistor 96 into the variable resistors 97, 98 and 123 of the variable T pad. The variable T pad serves as a means for introducing an adjustable amount of loss between the cathode output circuit of the tube V3 and the output terminals 99 and 100—where the voltage oscillation frequency is available for supply to a load or utilization circuit.

The A. C. or oscillation voltage across the resistor 87 is also coupled, by means of the capacitors 95 and 117, into and across the resistors 73 and 74. These resistors 73 and 74 together with the resistor 116, constitute the grid return resistors for the tube component V2B. Consequently, any voltages across these resistors are effective as signal voltages on the grid of the tube component V2B.

It has previously been stated that the D. C. operating voltages on the elements of the tube component V2B are such that no plate current can flow through this tube component in the absence of A. C. voltage in its grid circuit. This is accomplished by establishing a positive voltage at the cathode 33 which is greater than the positive voltage on the grid 114. The cathode 33 is positive (with reference to ground potential) by the amount of voltage across the resistor 113. The magnitude of the voltage across the resistor 113 is determined primarily by the resistance of the resistor 113 itself and the value of the resistor 31. It will be noted that the three resistors 31, 32 and 113 comprise a voltage divider circuit which is connected between the lead 27 and ground. The voltage across the resistor 32 can be considered, for practical purposes, to be the plate supply voltage for the tube component V2B.

In the absence of plate current through the tube component V2B, the capacitor 107 charges through the resistor 111 to the potential at the cathode 109 of the tube component V1B. If this condition of no plate current in the tube component V2B exists for a sufficiently long time, the voltage across the capacitor 107 becomes equal to the voltage at the cathode of the tube component V1B. Under this condition, the grid and cathode voltages of the tube component V1B are equal. Stated in another way, the tube component V1B is operating at zero bias. It has been explained earlier that this is the condition which allows a maximum loop gain to exist between tube components V1A and V2A and is therefore most permissive of the buildup of oscillations in this circuit.

When these oscillations build up to a sufficient magnitude, the positive portion of each cycle causes plate current to flow through the tube component V2B. This current flows into the capacitor 107 and reduces the potential between its terminals, thereby lowering the voltage on the grid 104 of the tube component V1B. Under these conditions, the grid voltage is less positive than the cathode voltage and the tube component V1B is operating at a negative bias. This causes a higher plate resistance in the tube component V1B and, as previously explained, a lowering of the loop gain of the tube components V1A and V2A. Thus, the amplitude buildup is halted and the amplitude of the oscillations is thereafter maintained at a substantially constant value. That this is the case will be evident from the fact that any increase or decrease in the magnitude of oscillation frequency voltage in the grid circuit of the tube component V2B will increase or decrease the plate current in that tube component. This will react on the gain of the circuit via the tube component V1B in such a manner as to reestablish the oscillations in its original amplitude.

By way of example, suppose the circuit has been oscillating at one of the frequencies selectable by the selector 39 and the frequency of oscillation is changed by means of the selector. Suppose that the impedance of the new circuit established through one of the inductors 46, 48 or 50 and a mating one of the capacitors 52 is lower than that of the previous circuit. As a consequence of the lower impedance of the circuit, the amplification or gain of the tube component V2A will be lessened. This results in a lower overall loop gain in the oscillator circuit of the tube components V1A and V2A. Because of this lower loop gain, the circuit will tend to oscillate at a lower amplitude. This results in a lower amplitude of A. C. voltage in the grid circuit of the tube component V2B and less plate current will flow in that tube component. This permits the voltage on the capacitor 107 to become more positive and therefore the grid bias on the tube component V1B becomes more positive; that is, less negative. With less negative bias on its grid 104, the plate resistance of the tube component V1B is lower with the result that the gain of the tube component V1A becomes greater. By this mechanism the loop gain of the circuit is restored and the amplitude of oscillation is fixed and maintained at substantially the same value as it was at the first frequency.

In a like manner, a higher impedance in the inductors 46, 48 and 50 and the capacitors 52 and consequent greater gain in the tube component V2A would result in a tendency to a higher amplitude of oscillation which would cause a greater plate current in the tube component V2B and a more negative bias on the grid 104 of the tube component V1B. This results in a larger plate resistance for the tube component V1B and a reduced gain in the tube component V1A, thus reestablishing the first value of loop gain in the tube component V1A and V2A of the oscillator circuit.

This same automatic gain control action is important to maintain the loop gain of the circuit and the amplitude of the output voltage independent of aging of the tubes or replacement of the tubes by others having different amplification factors.

The selector 39 is the make-before-break type so that the voltage supply to the plate 69 of the tube component V2A is maintained uninterrupted, even when a changeover is made to another of the inductors 46, 48 or 50. This is done primarily to avoid larger transient voltages when switching from one frequency to another.

I will now explain the new and novel method by which the amplitude of the A. C. output voltage of oscillation frequency is maintained at a substantially constant value, independent of the value of the A. C. power line voltage.

It has previously been established that the D. C. operating voltages on the elements of the tube component V2B are such that no plate current can flow through the tube component in the absence of A. C. voltage of oscillation frequency in its grid circuit. This is accomplished by the usual and well known expedient of arranging that the D. C. voltage between the control grid and ground is sufficiently less positive than the D. C. voltage between the cathode and ground.

Now the A. C. output voltage of oscillation frequency is proportional in magnitude to the net grid bias (difference between grid to ground and cathode to ground D. C. voltages) of the tube component V2B. If this grid bias becomes larger in magnitude, the A. C. output voltage of oscillation frequency will automatically become larger. Similarly, a smaller magnitude of grid bias automatically results in a smaller output voltage.

From the preceding explanation, it is evident that if the grid bias on the tube component V2B can be maintained constant and unchanging as the power line voltage varies, then the magnitude of the A. C. output voltage of oscillation frequency will remain constant and will not change with changes in power line voltage.

One way of accomplishing this is to employ a power supply in which the value of the voltage in the lead 27 is regulated. This solution is a satisfactory one electrically, but the additional size and weight required by the regulated supply were very undesirable in the present construction.

The new and novel method employed in the present construction as shown on the drawing, is designed to maintain a constant D. C. voltage difference between the grid 114 and the cathode 33 of the tube component V2B. The D. C. voltage from the cathode 33 to ground of lead 75 is that developed across the resistor 113 which is connected to the lead 27 through the resistors 32 and 31. The D. C. voltage from the grid 114 to ground is that developed across the resistor 73 which is connected to the lead 27 through two neon lamps 119 and 120 and resistor 121. Mathematically, the cathode to ground voltage can be expressed approximately as follows:

$$E_k = \text{Voltage of lead 27}\left[\frac{\text{Resistor 113}}{\text{Resistor 113}+\text{Resistor 32}+\text{Resistor 31}}\right]$$

The grid to ground voltage is as follows:

$$E_g = (\text{Voltage of lead 27} - E_n)\left[\frac{\text{Resistor 73}}{\text{Resistor 73}+\text{Resistor 121}}\right]$$

where $E_n$ is the voltage across the two neon lamps 119 and 120.

If the resistor values are chosen such that $$\frac{\text{Resistor 113}}{\text{Resistor 113}+\text{Resistor 32}+\text{Resistor 31}} = \frac{\text{Resistor 73}}{\text{Resistor 73}+\text{Resistor 121}} = K$$

then the voltage between cathode and grid can be written as follows:

$$\begin{aligned} E_{k-g} &= E_k - E_g \\ &= (\text{voltage of lead 27})(K) - (\text{voltage of lead 27} - E_n)(K) \\ &= (\text{voltage of lead 27})(K) - (\text{voltage of lead 27})(K) + (E_n)(K) \\ &= (E_n)(K) \end{aligned}$$

This last equation shows that the cathode to grid voltage, $E_{k-g}$, is not a function of the voltage in the lead 27 and, therefore, will not vary as the voltage in the lead 27 varies. Consequently, if the third equation, supra, is satisfied while at the same time achieving a satisfactory value for the grid to cathode voltage as described by the fourth equation, then the amplitude of the output voltage from the oscillator will not change if the voltage in the lead 27 changes.

It has been determined that in practice it is not necessary to satisfy the third equation exactly in order to realize a very high order of constant amplitude. As a matter of fact, I have found it easy to arrive at values for the resistors in the third equation such that the A. C. output voltage of oscillation frequency does not change more than 0.1 or 0.2 decibel, even though the amplitude of the A. C. power line voltage changed up and down as much as 20 volts from its normal value of 117 volts. Under these conditions, the grid to cathode voltage of the tube component V2B is being permitted to vary slightly in order to compensate for changes in oscillation amplitude that would otherwise result from changes in the heater supply voltage.

To those skilled in the art, many modifications of the present invention will be manifest. For example, with only minor changes in the illustrated circuit, a resistor-capacitor or a resistor-inductor type of phase shifting or tuning network can be employed in place of the inductor-capacitor combination shown with the selector 39 without departing from the spirit of the present invention. It also would be a simple matter to employ continuously variable frequency selecting elements rather than the step or increment type of selector 39 illustrated. In the frequency selector switch described and illustrated, no frequency determining element is subject to mechanical wear and consequent loss of accuracy.

Neon lamps could be substituted for the resistor 62 in order to provide a D. C. voltage drop without loss of A. C. voltage coupled into the grid circuit of the tube component V1A. This arrangement is especially valuable at low frequencies.

In order to provide an even better amplitude versus frequency characteristic, the resistance value of resistor 62, for example, or resistor 82 could be switched by a third deck on the selector 29. This would reduce the magnitude of the changes in the loop gain that have to be corrected for by the automatic amplitude control of the circuit.

While I have illustrated and described the preferred embodiment of my invention, it is to be understood that I do not limit myself to the precise construction herein disclosed and the right is reserved to all changes and modifications coming within the scope of the invention as defined in the appended claims.

Having thus described my invention, what I claim as new and desire to secure by United States Letters Patent is:

1. In combination, an oscillator circuit including means for tuning to a multiplicity of frequencies, an output circuit, a gain control circuit for determining the amplification in the oscillator circuit, a connection from said output circuit to said gain control circuit such that a change in voltage in said output circuit causes said gain control circuit to change the amplification in the oscillator circuit, the change in said gain control circuit being of opposite sense to said change in said output circuit so as to maintain the voltage in said output circuit substantially constant, said connection including a capacitor, and a grounded connection including a pair of resistors connected to said first connection between said capacitor and the gain control circuit.

2. The combination set forth in claim 1, wherein the first connection includes a resistor in series with the capacitor between the gain control circuit and the junction of said grounded connection with said first connection.

3. The combination set forth in claim 1, including a cource of direct current potential for said gain control circuit and said output circuit, and a second connection between said first connection and said source of direct current potential to maintain the amplitude constant.

4. The combination set forth in claim 3, wherein the second connection comprises a lead extended from between the resistors of said first connection and said source of direct current potential and including in series a pair of neon lamps and a resistor.

5. In combination, an oscillator circuit including a pair of tubes and a multi-position selector switch having a set of capacitors and a set of inductors and means for selecting among said capacitors and said inductors, an output circuit, a gain control circuit having a pair of tubes one of which acts as a variable resistance to determine the amplification in said oscillator circuit, a connection from said output circuit to said gain control circuit such that a change in voltage in said output circuit operates to cause said gain control circuit to change the amplification in the oscillator circuit, the change in said gain control circuit being of opposite sense to said change in said output circuit so as to maintain the voltage in said output circuit substantially constant, said connection including a capacitor, and a grounded connection including a pair of resistors connected to said first connection between said capacitor and said gain control circuit, and a source of direct current potential for said gain control circuit and said output circuit.

6. The combination set forth in claim 5, wherein the means for selecting among the capacitors and inductors comprises a pair of conductive arms, said arms being ganged for unitary manual movement with one arm moving among the capacitors and the other arm moving among the inductors.

7. The combination set forth in claim 6, including a second connection including a series, a pair of neon lamps and a resistor between said first connection and said source of direct current potential to maintain the amplitude constant.

8. A gain control circuit for use in electronic equipment, comprising a first tube having a grid for receiving both D. C. and A. C. voltages, a cathode and a plate; a grounded capacitor; a second tube having a grid connected to the plate of said first tube and to ground through said grounded capacitor; a cathode in said second tube for connection to D. C. voltage; a resistor connected between the grid and cathode of said second tube; a resistor connected between the cathodes of said tubes; a resistor connected to the cathode of said second tube and for connection to a source of positive D. C. voltage; and a resistor connected between the cathode of said first tube and ground, said second tube having a plate for connection to a source of positive D. C. voltage and to a signal circuit, whereby the gain control circuit will operate to maintain the A. C. voltage at the grid of said first tube substantially constant.

9. The gain control circuit of claim 8, wherein the D. C. voltage is coupled to the grid of said first tube by means of at least one neon lamp.

10. The gain control circuit of claim 8, wherein the D. C. voltage is coupled to the grid of said first tube by means of two neon lamps and a resistor in series.

11. The combination set forth in claim 5, wherein the first connection includes a resistor in series with the capacitor between the gain control circuit and the junction of said grounded connection with said first connection.

References Cited in the file of this patent

UNITED STATES PATENTS

| | | |
|---|---|---|
| 2,045,569 | Case | June 30, 1936 |
| 2,424,905 | Scheldorf | July 29, 1947 |
| 2,586,803 | Fleming | Feb. 26, 1952 |
| 2,606,285 | Balaille et al. | Aug. 5, 1952 |